United States Patent [19]

Swengel, Sr. et al.

[11] 3,988,563

[45] Oct. 26, 1976

[54] WELDING METHOD AND MEANS USING FOIL ELECTRODE

[75] Inventors: Robert Charles Swengel, Sr., Hellam; J. A. Crumley, Mechanicsburg, both of Pa.

[73] Assignee: AMP Incorporated, Harrisburg, Pa.

[22] Filed: Mar. 20, 1975

[21] Appl. No.: 560,069

Related U.S. Application Data

[60] Division of Ser. No. 305,192, Nov. 9, 1972, Pat. No. 3,891,789, which is a division of Ser. No. 55,614, July 16, 1970, Pat. No. 3,747,051, which is a continuation of Ser. No. 720,777, April 12, 1968, abandoned.

[52] U.S. Cl. .................................. 219/104; 219/96; 219/118; 219/137 R
[51] Int. Cl.² ........................................ B23K 11/04
[58] Field of Search ............... 219/95, 96, 100, 103, 219/104, 118, 137 R, 97

[56] References Cited
UNITED STATES PATENTS

| | | |
|---|---|---|
| 1,489,093 | 4/1924 | Mershon et al. ................. 219/96 X |
| 1,552,443 | 9/1925 | Mershon et al. ................. 219/96 X |
| 3,418,442 | 12/1968 | Roy ........................... 219/100 |
| 3,524,963 | 8/1970 | Swengel ....................... 219/100 |
| 3,539,762 | 11/1970 | Swengel, Sr. et al. ............ 219/118 X |

FOREIGN PATENTS OR APPLICATIONS

| | | |
|---|---|---|
| 1,383 | 1/1968 | Japan ........................ 219/118 |

Primary Examiner—J. V. Truhe
Assistant Examiner—N. D. Herkamp
Attorney, Agent, or Firm—Gerald K. Kita

[57] ABSTRACT

A welding method and means is disclosed utilizing a conductive foil disposed between or adjacent members to be welded together with the foil serving as one electrode and one or both of the members serving as another electrode of the welding circuit and with the members being forced together or with the foil being forced against the members by a separate electrode.

23 Claims, 21 Drawing Figures

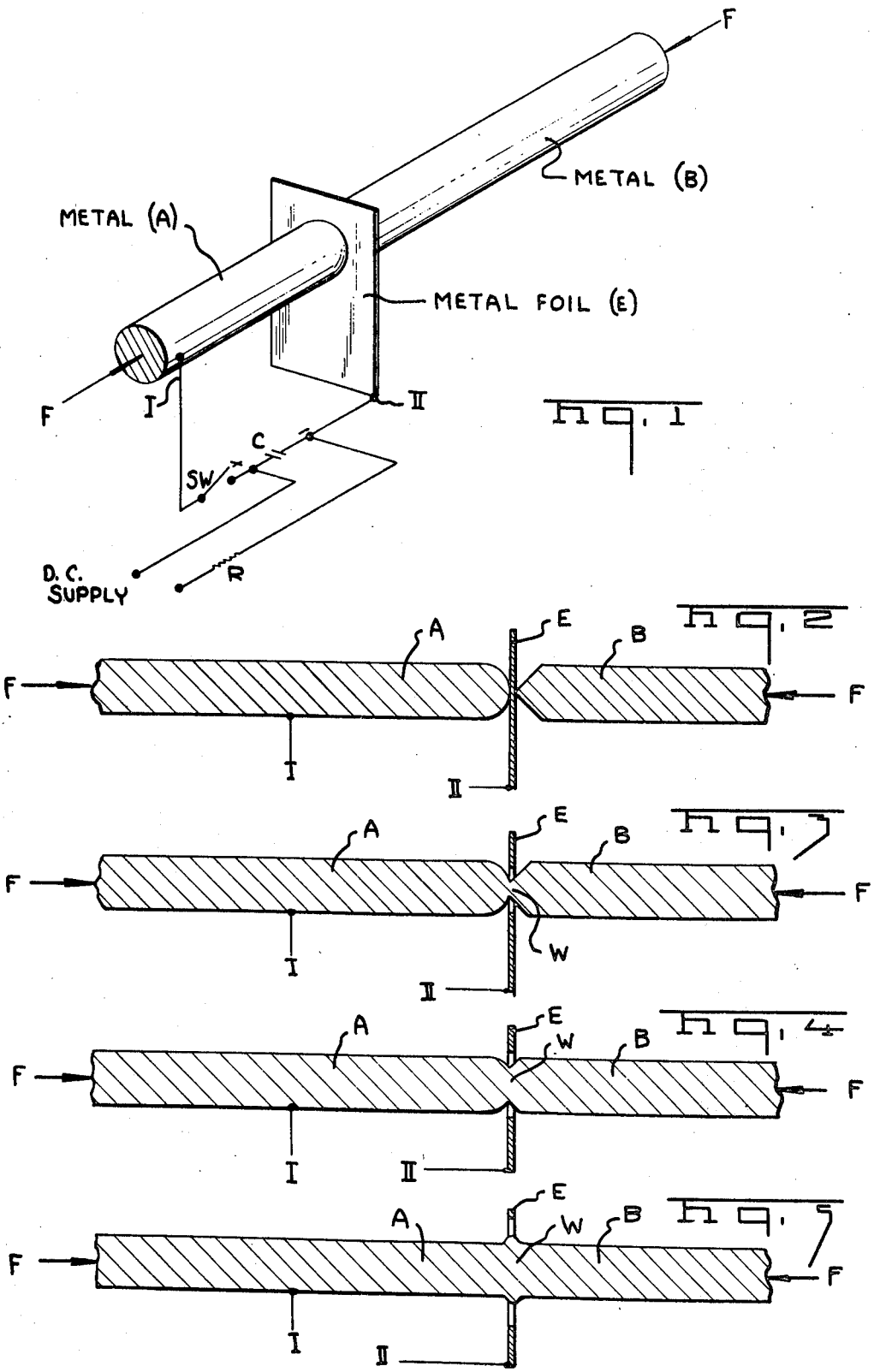

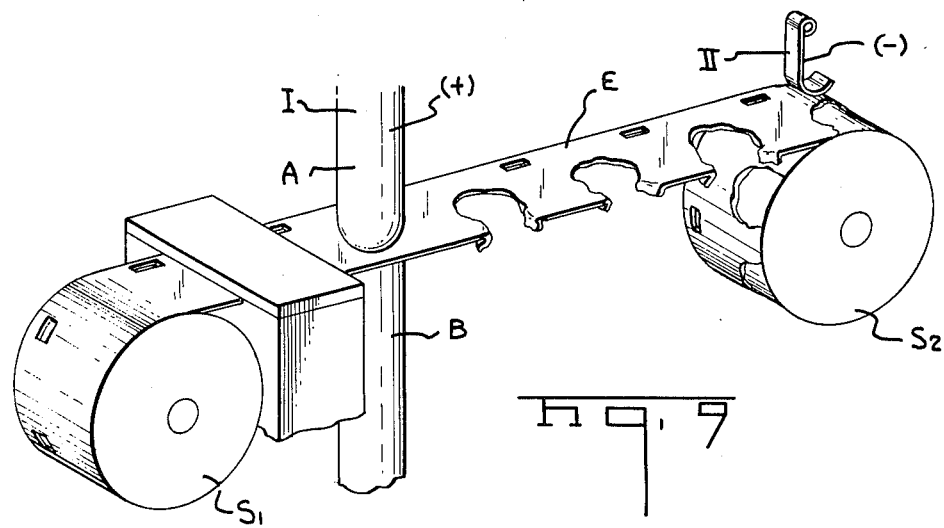
Fig. 7
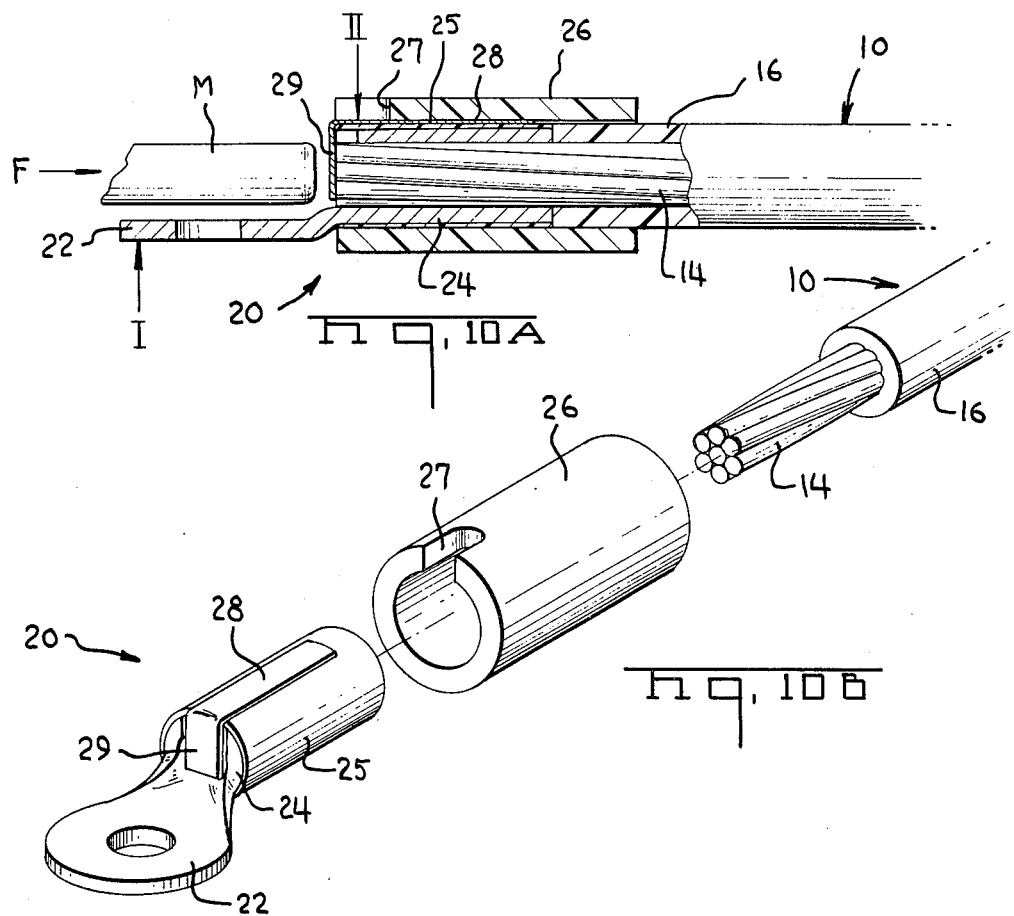
Fig. 10A
Fig. 10B

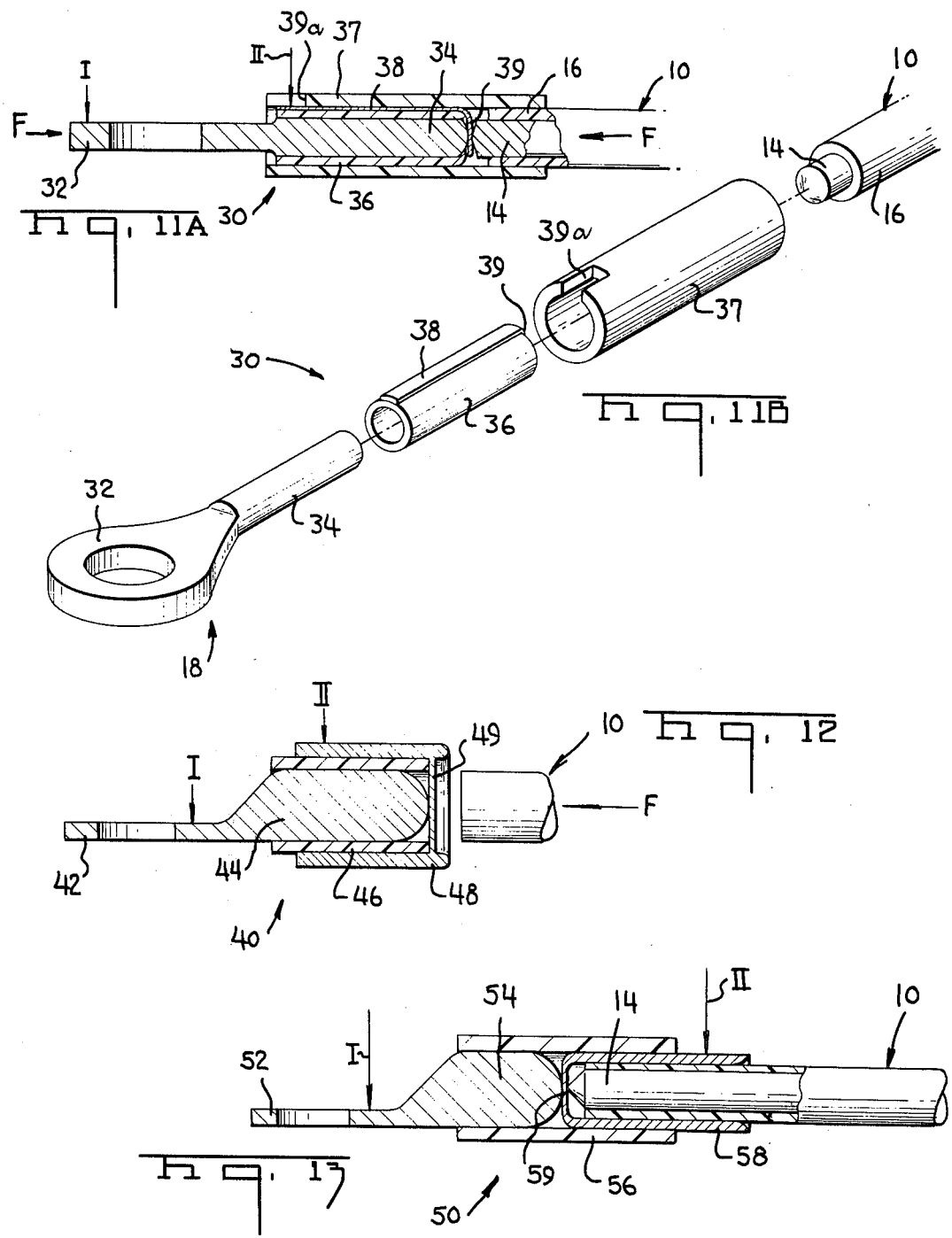

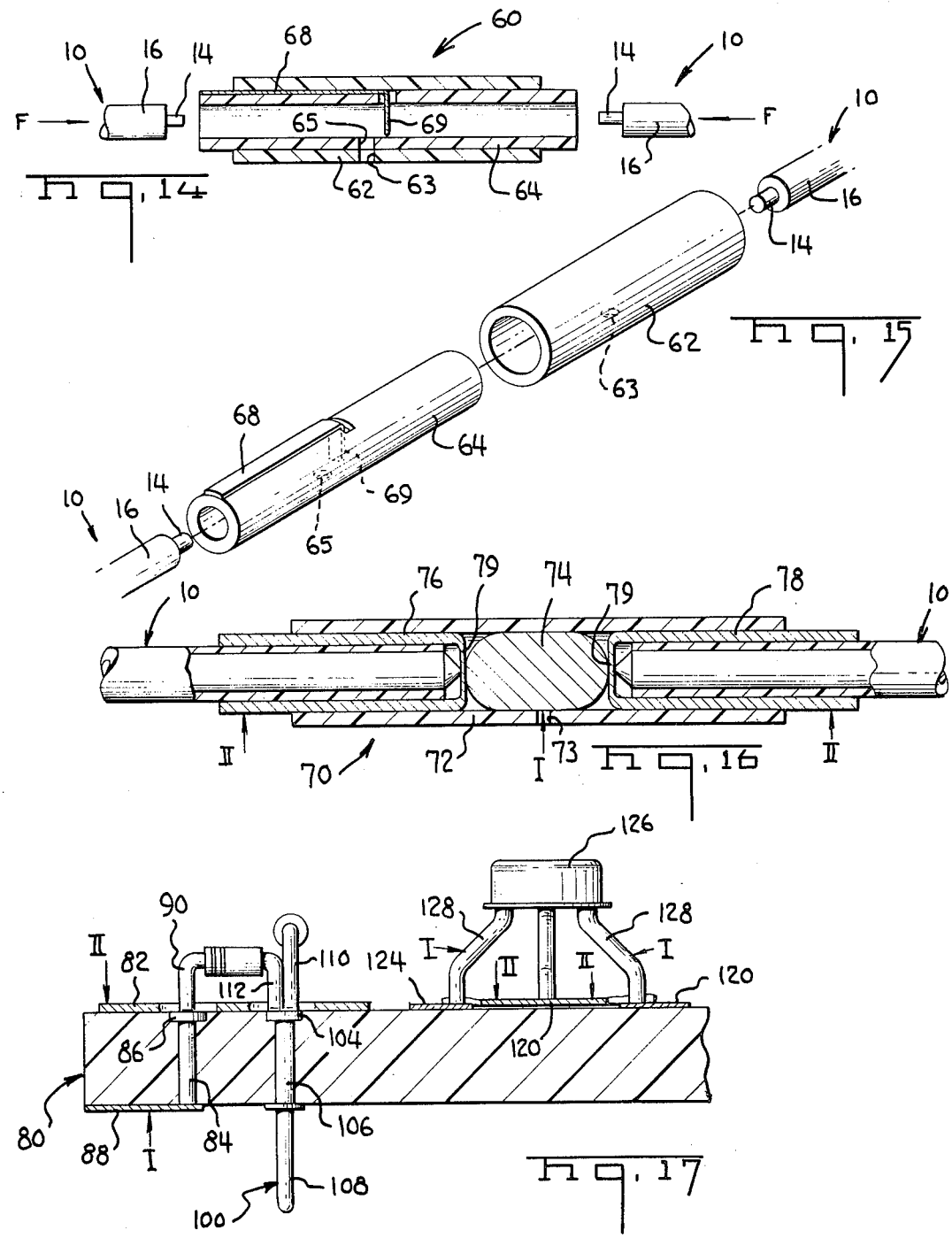

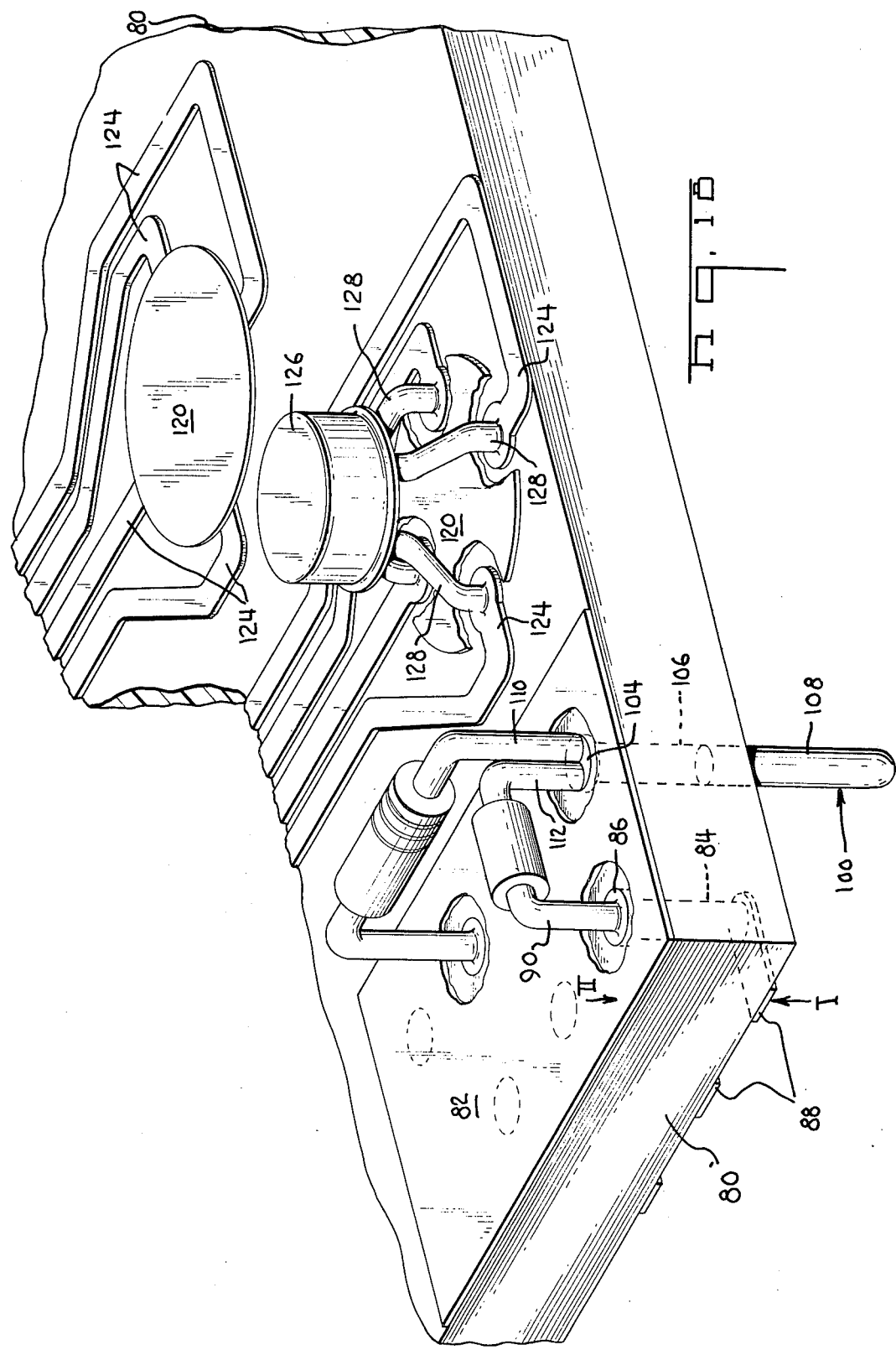

WELDING METHOD AND MEANS USING FOIL ELECTRODE

CROSS REFERENCE TO RELATED APPLICATIONS

This application is a divisional application of Ser. No. 305,192, filed Nov. 9, 1972 now U.S. Pat. No. 3,891,789, which is in turn a division of application Ser. No. 55,614, filed Jul. 16, 1970 and now U.S. Pat. No. 3,747,051, which is in turn a streamlined continuation of application Ser. No. 720,777, filed Apr. 12, 1968 and now abandoned.

BACKGROUND OF THE INVENTION

The heat released by an electrical arc has long been used for melting and fusion for joining metals together. Processes termed percussion, flash and projection welding are fundamentally similar in that the electrical arc which releases required energy is made to take place directly between the two metals to be joined. The sense of polarity (in the case of direct current) and the rise, duration and fall time of current flow are factors most often employed to control melting of the abutting surfaces before impact of the two members to be joined together and subsequent cooling which forms the weld.

Problems have been encountered in utilizing the foregoing processes with members of certain configurations and of certian metals or alloys relative to obtaining a molten surface on both of the members which are to be joined together. Due to the nature of the arcing process considerably more heat is liberated at the positive or anode surface of a member than at the cathode surface so that, even when the metals being joined are similar, uneven heating can result to produce a weld with degraded properties. Also in certain instances, it is neither practical nor desirable to make electrical contact with one of the members to be joined. An example is in the case of welding an enameled copper conductor to some electrical fitting. To make electrical contact to the copper conductor by stripping the enamel is both time consuming and costly and piercing the enamel coating usually results in damage to the conductor.

When metals to be joined together have widely different electrical and heat conductivities, it is very difficult to control direct arcing between them so as to control temperature rise and melting of the metals with present day processes. There are many instances applicable to both consumable and non-consumable electrode arc welding where the introduction of a new and fresh electrode surface for each welding cycle would offer substantial advantages. This is especially true for those processes utilizing short duration, pulsed arc techniques wherein it would be desirable to reproduce arching conditions from one cycle to the next regardless of the repetition rate at which the welds are made. Unless the members to be welded together are preconditioned or treated the introduction of precise amounts of fluxes, antioxidants, protective coatings and arc modifying agents like those used with coated rod type cathodes in consumable electrode welding cannot be readily accomplished in percussion, flash or projection type welding.

SUMMARY OF THE INVENTION

This invention relates to a welding method and means using a foil-like electrode interposed between or placed adjacent two or more metallic members to be joined together.

One object of the invention is to provide a novel method of welding metallic members together which eliminates to a large degree the need for skill in the welder. Another object is to provide a welding method and a means wherein criticalities of weld environment and power supply are substantially reduced. It is a further object to provide a welding method and apparatus which can produce welds of substantially constant characteristics at a relatively high repetition rate. It is still a further object to provide a novel electrode for welding and a number of novel articles incorporating such electrode.

The present invention overcomes the foregoing objectives through the use of a metallic foil or thin conductive member made to be an electrode of a welding circuit. The foil may be either an anode or a cathode, the latter use being preferred for many applications and used throughout the description; it being understood that the disclosure is intended to cover the alternative polarity in each embodiment illustrated. In one embodiment the invention contemplates welding metallic members by forcing the members together and using one or both of the members as an electrode with the metallic foil electrode interposed transversely between the members. With the electrodes thus positioned a connection is made to a source of energy to supply current which is forced to concentrate in the zone between the foil electrode and the workpieces to develop an arc plasma. The workpiece members are then forced together so as to maximize the interface or points of contact in the weld zone between the two workpiece members. The foil which serves as the electrode is controlled in thickness to first melt and then vaporize somewhat in the manner of an expanding iris, to become a circular or annular electrode developing the arc plasma which encircles the weld site. This is believed to provide a more even heating effect which contributes to the uniformity of fusion between metals. One of the workpieces can be completely out of the circuit initially, but under mechanical force so as to join the other workpiece at a time when the melting and vaporizing foil electrode is removed from direct physical contact, both workpiece members then effectively becoming eleectrodes. This causes both workpiece members to melt simultaneously to further improve the characteristics of the weld. The use of an electrode which is vaporized in the process of developing an arc plasma permits the use of a simplified circuit because as the foil electrode is vaporized a gap is created across which a given voltage of the power supply can no longer support the arc.

In an alternative embodiment the workpiece members to be welded together are positioned with end portions adjacent and with the foil electrode forced against the ends of the two workpiece members by a separate electrode which is used repeatedly; there being a fresh supply of foil electrode for each weld cycle for each set of workpieces to be welded together.

The invention contemplates a variety of forms of foil having particular characteristics to faciliatate a use as on reels or rolls or in separate pieces or as a tape to be applied to a weld site. The invention contemplates that various materials may be added to the foil such as an adhesive to hold the foil in proper position over a weld site or arc modifying materials carried by the foil.

The invention contemplates a particular use of the various alternatives in a number of specific embodiments in the form of articles for terminating workpiece members which serve to complete an electrical circuit.

In the drawings:

FIG. 1 is a schematic diagram showing metallic members to be joined together, positioned relative to a thin metal or foil member and a circuit for effecting a weld between such members;

FIG. 2-5 show the members of FIG. 1 in section in various conditions during an application of the method of the invention;

FIG. 7a is a schematic diagram showing in partial section an alternative embodiment of the invention wherein the members to be welded together are coaxially disposed relative to a thin metal or foil member, a circuit and a separate electrode for effecting a weld at the ends of such members;

FIG. 7b is a view of the workpiece members following welding in accordance with the embodiment of FIG. 7a;

FIG. 9 is a perspective view showing yet a further alternative wherein the foil cathode is in roll form and used with a weld of workpiece members in abutting relationship;

FIG. 10a is a sectional view showing a terminal structure incorporating a foil electrode in one embodiment, with a welding electrode shown approaching the weld site;

FIG. 10b is a perspective and exploded view of the structure of FIG. 10a;

FIG. 11a shows in longitudinal section a terminal structure in an alternative embodiment for terminating an electrical lead through an abutting engagement;

FIG. 11b is a perspective and exploded view of the terminal structure of FIG. 11a;

FIGS. 12 and 13 are longitudinal sections of alternative embodiments for terminal structures similar to that of FIGS. 11a and 11b, but with a different arrangement of foil electrode;

FIG. 14 is a longitudinal section of an electrical splice for connecting two electrical leads together;

FIG. 15 is an exploded perspective of the splice of FIG. 14;

FIG. 16 is a longitudinal and sectional view of an electrical splice in an alternative embodiment;

FIG. 17 is a longitudinal and sectional view of a component board illustrating a number of different structures for terminating and connecting components and leads at selected positions thereon; and FIG. 18 shows the board of FIG. 17 in perspective.

DESCRIPTION OF PREFERRED EMBODIMENT

Figure 6:
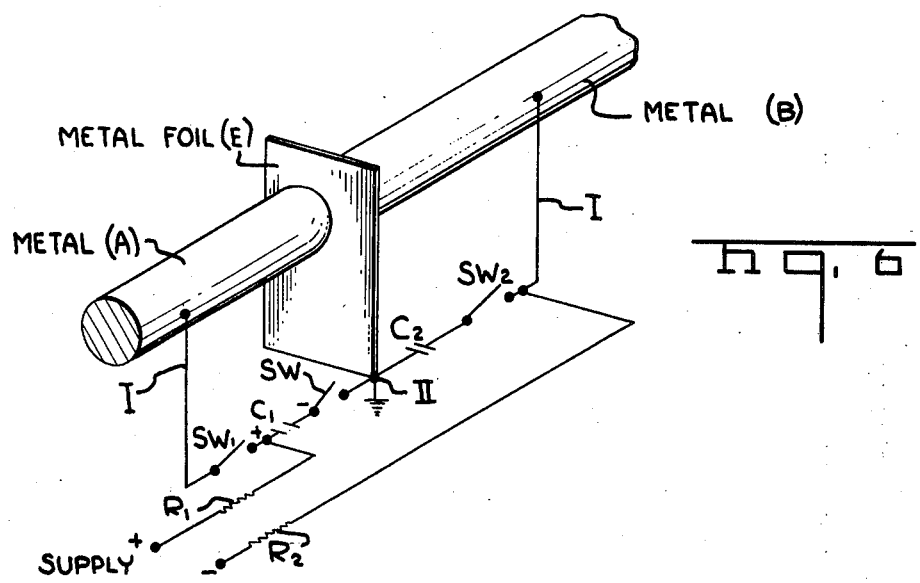
FIG. 6 is a schematic diagram showing metallic members to be joined together relative to a foil member and a circuit for effecting a weld between such members in another embodiment wherein both of the members to be welded together are initially connected as anodes in the circuit.

Referring now to FIG. 1, two workpiece members A and B, are shown preparatory to being joined together by a weld made through a third member E, which is a thin metal sheet or foil. An energy supplying circuit is shown to include a d.c. voltage source connected across input leads, in turn connected across a capacitor C, which is charged by such supply. The capacitor, relative to such leads, is connected to have a polarity as indicated. A switch SW is provided to effect a discharge of the positive plate of the capacitor to cause a flow of current through a lead I connected to the metal member A and then through the foil E to the negative side of the capacitor through a lead II. A suitable limiting registor R is utilized in the circuit to control the charging rate of C. Also, suitable isolation (not shown) would normally be provided to prevent the discharge of the circuit from affecting the supply. It is to be understood that a number of other energy supplies may be utilized to develop the type of current pulse necessary to cause a welding of the two members in accordance with requirements to be hereinafter given.

FIG. 2 shows the structure and circuit leads of FIG. 1 in section prior to welding. The member A is shown as somewhat rounded and the member B is shown as generally pointed. The member A may be thought of as an electrical lead or any body of conductive metal to which it is desired to weld a further member. The member B may be thought of as an electrical lead or other body to be welded to the member A. Typically, if B is an electrical lead it will have some centrally projecting point left by the tool utilized to sever the lead in preparation for application to A.

The member E, which has been disclosed as a thin metal or foil, is interposed transversely between A and B, as indicated. It is preferred to apply a force F to one or both of the members A or B so as to cause the members to be pressed together against the foil E, prior to application of current resulting in a weld of the members. This force may be developed by any suitable means. One such means is shown in U.S. Pat. No. 3,524,963 filed Feb. 17, 1965, in the name of R. C. Swengel, R., which teaches using the current which supplies energy for welding in a solenoid apparatus to drive the two members together. The amount of force which may be used to effect a weld ranges from a very small amount on the order of several grams up to many pounds. The force required to secure a weld of improved characteristics depends upon the characteristics of materials which are being welded together, such as hardness; the surface configuration in the area of contact and the condition of the surfaces, pointed or flat; and the condition of the surface of contact, heavily oxidized or covered with an insulating coating.

From the circuit shown in FIG. 1 it will be apparent that A is the anode and E is the cathode of the circuit prior to switch closure. On closure of switch SW a surge of current flows through the anode member A to the point of engagement with the cathod E and return. The current is substantially concentrated in the zone of engagement between A and E and current level is made to be sufficient to cause the foil to vaporize in this zone through a plasma arc which extends as generally shown in FIG. 3, from E to both A and B. This arc is circular and surrounds the weld site, as shown in FIG. 4. At this time, since the member B is forced against A, which is the circuit anode, the material of B, it is believed, also becomes an anode. As the arc continues and as the member B continues to move toward A, the hole in the foil caused by the arc expands in a circular fashion until finally a point is reached wherein the gap between the foil E and the members A and B is sufficiently great to extinguish the arc, as shown in FIG. 5. This operates to relieve criticality in controlling the pulse of energy utilized to effect the weld.

The dynamic nature of the hole in the electrode formed by the foil has been compared to an opening iris in that it expands in circular fashion. This causes the electrode E to automatically and evenly recede from A and B as it vaporizes. The phenomena of providing an insulating void between the welded members, and the electrode becomes a basis for extending the utility of the invention to certain articles, as will be described.

It is contemplated that with certain foil configurations and materials it may be desirable to also control the shape of the energy pulse to give an additional measure of control over the characteristics of the arc plasma generated. This may be done by pulse length control in a standard manner well known in the art by a timed starting and stopping of pulse energy.

It has been discovered that aluminum foil makes a good electrode for welding metallic members of the type typically used for electrical conductors, such as component tips or the like, or electrical contact members made of copper or brass. While it is belived the aluminum, upon vaporization, operates as an oxygen getter to improve the characteristics of the weld resulting from its use, some other reactive phenomena may be involved. It is intended that the term foil include any integral, relatively thin, metallic member formed in any suitable manner as by rolling, or by depositing or plating techniques.

In an actual example, No. 16 AWG Formvar coated solid copper wires were welded together using aluminum foil, 0.002 inch thick, though a current pulse developed by discharging a 50K microfarad capacitor charged to a potential of 45 volts, dropped to a potential of about 30 volts by the arc and circuit losses. The two wires were forced together by securing one of the wires against movement, placing the other wire in a movable fixture and then tapping the fixture with a hammer to drive the two wires together in light impact. The impact was utilized to start current flow from the circuit which was previously connected with the fixed wire as an anode and the foil as the cathode. As a matter of practice, using contact with the foil to initiate the arc is preferred over the use of a mechanical switch, shown for illustration. A satisfactory weld of the two wires resulted which extended evenly around the wire periphery with slight damage to the insulation of either wire. A circular hole approximately 0.100 inch in diameter appeared in the aluminum foil electrode.

Experience with numerous examples of welds and other materials indicates that the invention may be employed to weld together a variety of types of conductive materials in various geometries with different foils. The expression foil or thin electrode is somewhat relative to the size of conductive members to be welded together and to the pulse employed. Welds using foil of 0.001, 0.002 and 0.005 of an inch in thickness have been accomplished.

Turning now to an alternative embodiment of the invention, FIG. 6 depicts two members A and B preparatory to being joined together by a weld made through a foil E by a circuit also connected to member B. A separate supply is provided for each of two capacitors C1 and C2 through limiting resistors R1 and R2. Switches SW1 and SW2 are maintained in an open position during the charging cycle to permit the capacitors C1 and C2 to be charged to either the same or different potentials. Anode leads from each of the circuits identified as I are connected to the members A and B from the circuit and the cathode side of each circuit is connected to the foil E by a lead II. Upon closure of the switches the action generally described with respect to FIGS. 2–5 will result in a welding of the members A and B together. Through the circuit of FIG. 6 a higher energy pulse may be developed with the same type of supply. During the initial phase of the welding cycle a current flow occurs from A through E independent of a current flow from B through E. It is contemplated that by using the circuit of FIG. 6, at least an initial variation in heating of the members A and B may be achieved to facilitate a welding of members A and B of different characteristics. While the switches are shown schematically as physically separate, it is contemplated that in actual practice the switches would be provided with a common opening and closing mechanism.

Figures 7A, 7B:
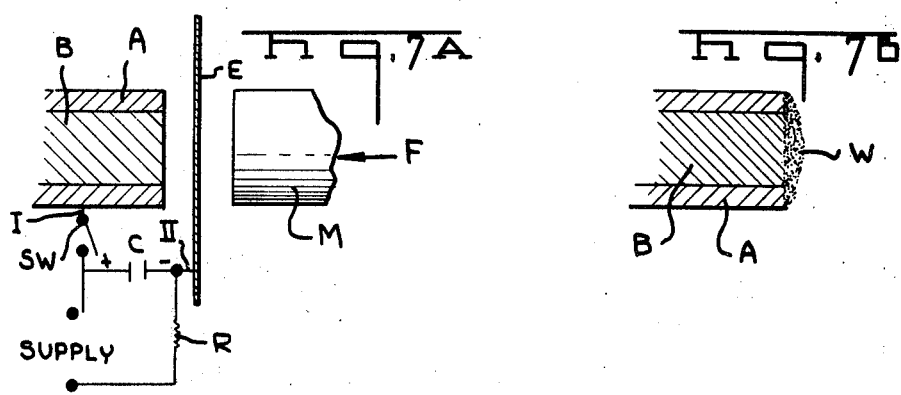

In FIG. 7a, a further alternative of the invention is disclosed wherein the members A and B prior to welding have adjacent edges and are not in a forced abutting engagement. The view in FIG. 7a may be considered as a section through a structure wherein A is a tubular member and B is a rod shaped member and the two members are thus coaxially disposed. Alternatively, FIG. 7a may be considered as a section of a lamination of strips with ends positioned as shown. The member A might be considered as the barrel portion of the terminal and B as a conductive wire inserted therein. Alternatively, A might be considered as defining portions of leads positioned adjacent a terminal post B in which event lead I would be connected to both the upper and lower portions of A represented in FIG 7a. It is also contemplated that lead I may be connected to the inner member B if the geometry of the device readily permits. The circuit shown includes a capacitor C arranged to be charged through a limiting resistor R by a suitable supply. The capacitor C is connected through a switch SW to the lead I which is made the anode of the circuit and is connected to the foil E through a lead II which makes the member E the cathode of the circuit. There is additionally provided a mandrel M which may be of a material such as tungsten capable of repeated use in welding different sets of workpiece elements A and B. In accordance with the invention, mandrel M is brought in to bear against E pressing E against A and B at which time switch SW is closed to provide a discharge of the circuit vaporizing E, melting A and B and providing a weld W as shown in FIG. 7b.

Figure 8:
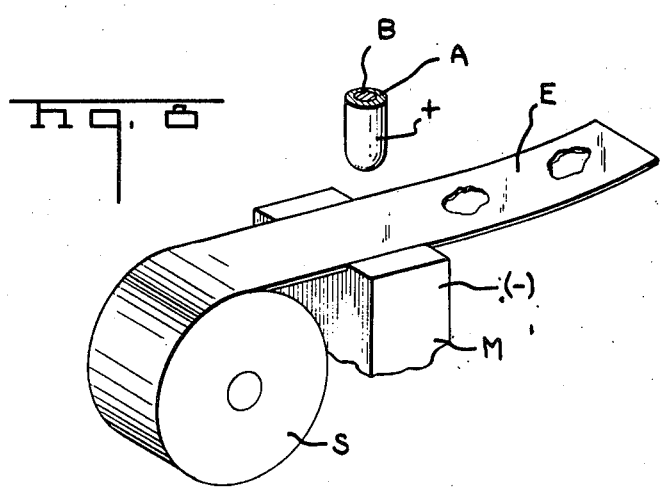
FIG. 8 is an illustrative embodiment showing in perspective an arrangement for welding members in the configuration of FIG. 7a by using a tape-like foil cathode supplied from a roll.

It is contemplated that as an alternative embodiment the lead II can be connected to mandrel M of FIG. 7a rather than directly to the foil E so that when the mandrel M is forced against the foil C it effectively becomes a welding electrode which is a cathode in the circuit. FIG. 8 shows an arrangement of this type wherein the mandrel M is made negative and there is provided a supply of foil S which may be indexed to provide a fresh supply of foil E for each welding cycle. Workpiece members A and B are brought down from the position shown in FIG. 8 to bear against the foil E and against the mandrel M at which time a switch is closed to effect a discharge resulting in a weld of the members A and B together in the manner previously described. The arrangement of FIG. 8 lends itself to production welding of a series of members A and B preassembled and carried by some suitable means to the position of weld shown in FIG. 8. FIG. 8 shows apertures left in the foil E from previous welds.

FIG. 9 shows an embodiment utilizing a tape supply of foil E for a butt weld of members A and B. A supply S1 feeds fresh foil through the work stations to a pickup reel S2. In the embodiment of FIG. 9, the foil E is connected to a lead II through a contact spring as indicated and the member A is connected to the lead I in a circuit like that previously described. After a weld has been achieved the members A and B are removed from the aperture formed in E by being forced through a portion of E.

In conjunction with the techniques and methods previously described, a number of article embodiments have been discovered which will now be described. FIGS. 10a and 10b depict a ring-tongue terminal 20 of a type widely used to terminate conductors like 10, which include a conductive cores 14 surrounded by an insulating sheath 16. The construction of the terminal 20 is adapted for use of the invention method revealed in FIGS. 7a and 7b. The terminal 20 includes a ring portion 22 with a sleeve extension 24 having an inner diameter to receive the stripped end 14 of the wire lead 10 inserted therein to a position wherein the end of 14 is substantially flush with the end of 24, as shown in FIG. 10a. A foil electrode 28 is provided with an end 29 extended down over the open end of 24. The foil is held in position prior to use by insulating sleeves 25 and 26 fitted about 24. The sleeve 26 is made to extend outward to provide support for the wire lead 10 by an engagement with insulating sheath 16. Sleeve 26 includes a relieved portion 27 disposed to provide access to 28 at a point removed from the weld site by an electrode of the welding circuit. The foil 28 is made the cathode of the circuit by a negative lead II, as shown in FIG. 10a. The positive lead I of the welding circuit is connected to the ring tongue 22 also as shown in FIG. 10a. A mandrel M is brought to bear against the assembled elements and a weld is made in accordance with the description given relative to FIGS. 7a and 7b.

In conjunction with the invention method, a number of other invention embodiments have also been conceived. FIGS. 11a and 11b depict a ring-tongue terminal structure 30 adapted for a butt connection to a lead 10. The terminal 30 includes a portion 32 adapted for connection to a terminal block. Extending therefrom is a shank 34, preferably integrally formed with portion 32. Shank 34 may be rounded at the end to concentrate initial arcing current. A first plastic and insulating sleeve 36 is fitted over shank 34 and carries on its outer surface a foil electrode 38 which includes a tab portion 39 extended down over the end of 36. The forward end of 38 serves as a point of contact for a positive lead II of the circuit and the tab shown as 39 serves as that part of the cathode which is interposed between the conductive members to be welded together. Surrounding sleeve 36 and foil 28 is a further insulating sleeve 37, which is open at both ends and includes a slot in one end shown as 39. This slot exposes a portion of foil 28 for attainment of the circuit lead.

With the terminal assembled as indicated in FIG. 11a, positive lead I is attached to the portion 32 and the negative lead attached as at II to the foil. Application of a suitable energy pulse with force being applied to drive the conductor 14 in against tab 39 results in a weld in accordance with the method of the invention hereinabove described with respect to FIGS. 1–5. The insulating sleeves 36 and 37 may be made of a material which will withstand substantial deterioration or damage due to the plasma of ther arc; or, if desired, these sleeves may be of a material made to partially melt to completely seal the weld zone.

FIG. 12 shows an alternative embodiment of a ring tongue terminal 40 having a forward portion 42 with a rear shank 44, surrounded by a plastic supporting sleeve 46 and a cap 48 of aluminum or other suitable metal.

The closed end 49 of cap 48 is suitably thin to provide the foil structure heretofore described. A circuit like that of FIGS. 1–5 would be used as previously discussed with a positive lead I attached to 42 and a negative lead II attached to 48. An overlying protective insulating sheath, not shown, could be used as in the previous example of FIGS. 11a and 11b.

FIG. 13 shows a further alternative embodiment of a ring tongue terminal 50 having a forward portion 52 and a rear shank 54 surrounded by plastic supporting sleeve 56. An aluminum or other suitable metal cap 58 is provided surrounding the end 14 of lead 10 with an end 59 made to extend transversely between 14 and the end of 54. The cap is made to extend out of the rear of sleeve 56 to provide access for a negative lead II, the positive lead I being attached to 52. As above, a further insulating sleeve, not shown, may be fitted over the sleeve cap assembly. The embodiment of FIG. 13 would be welded through the circuit shown in FIGS. 1–5.

FIGS. 14 and 15 show a splice embodiment used to join the conductive portions of two leads, in a butt joint. Again, these leads have an outer insulating sheath 16 surrounding an inner conductive core 14. The splice 60 is comprised of an inner insulating sleeve 64 having on the outside surface thereof a foil 68 which includes a tab 69 made to extend transversely down into the sleeve 64. An aperture 65 is provided in the bottom of 64 as shown. There is provided an outer sleeve 62 which is open at both ends and which includes an aperture 63 removed some distance from the end. FIG. 14 shows the splice 60 assembled with the lead ends 14 prior to being inserted therein to press against each other through the foil tab 69. The outer sleeve 62 is axially displaced to a point to permit a positive lead I to be attached to the conductor of the left-hand lead through the apertures 63 and 65 and a negative lead II to be attached to the foil 68. Application of an energy pulse to the leads I and II will form a weld between the two leads in the area of the ends thereof. Again, suitable insulating material may be chosen to permit a controlled melting of the sleeves to seal the weld.

FIG. 16 shows an alternative embodiment of a splice 70 for joining two leads 10. The splice includes a plastic sleeve 72 having a small aperture 73 in the center thereof to facilitate insertion of a positive lead I of the welding circuit. In the center of the sleeve is a metallic plug 74 which serves as a welding base against which the ends of the leads are pressed. Metallic caps 76 and 78 having a thinned transverse end such as 79 are provided for each lead as shown. A portion of each cap is made to extend out of the sleeve 72 for access by negative leads II. As previously mentioned, the insulating sleeve may be made of a material to melt in the region of areas without being destroyed to seal the weld sites. An additional sleeve, not shown, may be provided over the assembly including the exposed cap portions.

The embodiment of FIG. 16 is capable of being used to join wires of substantially different metals with the caps being either of the same or different metals, as required.

It is contemplated that in the various foregoing embodiments, crimping dies may also be used in a standard manner to compress the outer sleeves after or during welding to further perfect the connection and particularly a sealing thereof.

FIGS. 17 and 18 show an insulating board or panel 80, having a thin foil 82 disposed on the surface thereof. The insulating board may be one of any number of materials utilized for component panel construction, such as phenolic resin, diallyl phthalate or the like. The foil 82 is preferably bonded to the surface of 80. Mounted in or on 80 are a number of representative types of conductive members. One such member is in the form of a post or pin 84, which extends through the panel on one side to engage the foil through a headed portion 86 and on the other side thereof to join a flat strip portion 88 which may be integrally or separately connected to 84. The portion 88 may be positioned at the edge of the panel for use with edge type connectors or any further suitable connection.

In accordance with the invention, a positive lead I is attached to the portion 88 and therefore to 84 and 86, with a negative lead II attached to the foil 82. A component or lead 90 is then pressed against 82 and 86. Application of a pulse of sufficient energy operates as previously described to cause a weld to take place between 90 and 86, therefore connecting 90 to 84 and 88. When welding occurs foil 82 pulls back in the circular fashion away from the conductive portions of 90 and 86. The diameter of head 86 should, therefore, be limited so that the foil forms an aperture to insulate the conductive path of 90 and 86 from the remainder of the foil electrode.

FIGS. 17 and 18 also show a terminal post 100 secured in the panel 80 with two component leads 110 and 112 joined together through a head 104 formed on a support portion 106 having a post 108 extending out of the rear frame of the board. Again, the foil is effectively removed from contact from the leads to leave the termination insulated.

The panel 80 in FIGS. 17 and 18 also includes a portion which contains base members 120 connected to printed circuit conductive paths 124 and disposed on only one side of the panel. A component can 126 having multiple leads 128 is shown welded to appropriate circuit paths 124 through a welding circuit including leads I and II positioned as shown in FIG. 17. The foil 120 is in this case made to be localized to the site of a series of welds relative to the surface of 80.

Having now described the invention in terms intended to enable preferred modes of practice thereof, the following claims are included to define what has been invented.

What is claimed is:

1. In a method of forming an arc for joining metallic members, the steps comprising placing two metallic members together with a thin conductive member positioned thereagainst, applying current via a circuit connected to at least one of said members with at least one of said two members being initially an electrode and the thin member being initially an electrode in said circuit and with the current, relative to the thickness and characteristics of the thin member, being sufficient to cause said thin member to vaporize at the interface of the two members progressively radially outward from the said interface to draw an arc extending from said thin member to the two members around said interface and bringing said members together to form a joint.

2. The method of claim 1 wherein the said two metallic members are placed in abutment with the said thin conductive member positioned therebetween.

3. The method of claim 1 wherein one of said two members includes a tubular poriton and the other of said two members includes a portion extended within said tubular portion with surfaces of the portions of two members substantially flush and the thin conductive member thereagainst.

4. The method of claim 3 wherein there is provided a further member which is forced against the thin conductive member to in turn force such member against the said two metallic members.

5. In a method of forming an arc for joining metallic members, the steps comprising placing two metallic members together with a thin conductive member positioned thereagainst, applying current by a circuit connected to said members with both of said members being initially an electrode and the thin member being initially an electrode in said circuit and with the current, relative to the thickness and characteristics of the thin member, being sufficient to cause said thin member to vaporize at the interface with the two members progressively and radially outward from the said interface to draw an arc extending from said thin member to the two members around said interface and means for bringing said members together after vaporization of said thin metallic member.

6. In a method of forming an arc for joining metallic members, the steps comprising placing at least two metallic members together with end portions adjacent and with a thin conductive member positioned against said end portions, applying a current by a circuit connected to at least one of said members with at least one of said members being initially an electrode, forcing said thin member against said two portions by a further member which is connected to said circuit so as to be initially an electrode when said further member is forced thereagainst and then through said circuit applying a current relative to the thickness and characteristics of the thin member to cause said thin member to vaporize at the interface with the said two members progressively and radially outward from the said interface to draw an arc extending from said thin member to the two members around said interface and bringing said members together to form a joint.

7. In a method of evenly heating metallic members the steps comprising providing at least two metallic members and a thin conductive member transversely disposed thereagainst and extending radially outwardly of edge surfaces of said members, applying a current in a circuit including at least one of said two members and said thin member in series, said current being sufficient, relative to the thickness of said thin member, to vaporize said thin member drawing an arc extending from portions of said thin member to embrace both of said two members and bringing said members together to form a joint.

8. A connecting method comprising the steps of placing together at least two metal members to be connected together with a thin conductive member disposed therebetween, applying a current of sufficient energy to cause an arc with at least one of said metal members being an electrode and with the thin member being an electrode and with said current causing said thin member to vaporize in the zone adjacent said two members to melt said members and effect a fusion therebetween and bringing said members together to form a joint.

9. The method of claim 8 wherein said thin member is made to extend radially outward of said two members and said current is made sufficient to vaporize said thin member radially outward of said two members.

10. The method of claim 8 wherein said thin member is made to extend across the entire facing surfaces of said members and said current is made sufficient to vaporize substantially all of said thin member between said two members.

11. The method of claim 8 wherein said thin member is made to extend radially outward of said two members co-extensive with the periphery thereof and said current is made sufficient to vaporize said thin member to draw said arc to extend from said thin member generally inward toward the ends of said two members to evenly heat both members about the periphery thereof.

12. The method of claim 8 wherein one of said members includes a tubular portion and the other member is positioned therewithin with the end surfaces of said members substantially flush.

13. The method of claim 8 wherein said current is made sufficient to vaporize said thin member to a point to provide a gap in said circuit extinguishing said arc.

14. The method of claim 8 wherein said two members are forced relatively together in engagement with both of said two members becoming electrodes.

15. The method of claim 8 wherein said thin metallic member is an electro-positive metal.

16. The method of claim 8 wherein said thin metallic member has characteristics to serve as an oxygen getter during vaporization as said arc is generated.

17. The method of claim 8 wherein said thin member is a foil.

18. The method of claim 8 wherein said thin member is aluminum foil.

19. A welding method comprising the steps of forcing at least two metal members together with a foil-like metallic member disposed transversely therebetween and applying a pulse of sufficient energy to cause an arc to be struck in the zone between said members vaporizing said foil-like metallic member and melting said two members with the force driving said members together assisting a fusion of the melted portions of said members.

20. A method for welding at least two metallic members together, including the steps of butting one member against a foil-like metallic member and thereby against a further metallic member under compression and striking an arc sufficient to form an arc plasma disintigrating at least the portion of the foil-like member between said members to effect a melting of the two members in a region of contact therebetween left by the disintegrated foil-like member whereby the ends of said metallic members are fused in the region of melt.

21. In an apparatus for welding metallic members together a source of energy capable of being switched to develop a current flowing in a circuit including an anode lead and a cathode lead, one of said leads including one of the members to be welded and the other lead including a thin metallic member inserted between the members to be welded together, the said thin member having a thickness controlled to be vaporized by the said current to develop an arc plasma melting the ends of said members providing a fusion thereof and means for bringing said members together after vaporization of said thin metallic member.

22. A welding method comprising the steps of placing at least two metal members with portions thereof in contact and with a foil-like metallic member disposed proximate said portions and overlying said portions, forcing said foil-like metallic member against said portions with a further member to effect an intimate contact therewith, applying a current to said foil sufficient to develop an arc plasma melting said two members to result in a fusion thereof.

23. The method of claim 22 wherein said foil is made an electrode and at least one of said two members is made an electrode relative to applied current.

* * * * *

UNITED STATES PATENT OFFICE
CERTIFICATE OF CORRECTION

PATENT NO. : 3,988,563
DATED : October 26, 1976
INVENTOR(S) : ROBERT CHARLES SWENGEL, SR. ET AL It is certified that error appears in the above-identified patent and that said Letters Patent are hereby corrected as shown below:

Column 10, Claim 5, line 28, delete "means for".

Column 10, Claim 5, line 29, delete "bringing said members together after vaporization of".

Column 10, Claim 5, delete line 30.

Column 10, Claim 5, line 28, add the following after the word "and" ---bringing said members together to form a joint.---.

Signed and Sealed this

Twenty-first Day of December 1976

[SEAL]

Attest:

RUTH C. MASON
Attesting Officer

C. MARSHALL DANN
Commissioner of Patents and Trademarks